United States Patent
Lee et al.

(10) Patent No.: US 7,446,000 B2
(45) Date of Patent: Nov. 4, 2008

(54) METHOD OF FABRICATING SEMICONDUCTOR DEVICE HAVING GATE DIELECTRICS WITH DIFFERENT THICKNESSES

(75) Inventors: Sun-hak Lee, Ulwang-si (KR); Kwang-dong Yoo, Seongnam-si (KR); Sang-bae Yi, Seoul (KR); Soo-cheol Lee, Seoul (KR); Mueng-ryul Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/826,714

(22) Filed: Jul. 18, 2007

(65) Prior Publication Data

US 2008/0124873 A1    May 29, 2008

(30) Foreign Application Priority Data

Jul. 18, 2006    (KR) ...................... 10-2006-0067097

(51) Int. Cl.
*H01L 21/8234*    (2006.01)
(52) U.S. Cl. ...................... 438/275; 438/410; 438/425; 438/426; 438/452; 257/E21.082; 257/E21.267; 257/E21.282; 257/E21.283; 257/E21.284
(58) Field of Classification Search ................ 438/410, 438/425, 426, 275, 165, 225, 297, 362, 431, 438/439, 452, 199, FOR. 395, 981, FOR. 490; 257/E21.082, E21.267, E21.282, E21.283, 257/E21.284, E21.592
See application file for complete search history.

(56) References Cited

U.S. PATENT DOCUMENTS 5,037,768 A * 8/1991 Cosentino ................... 438/366
5,726,477 A * 3/1998 Williams et al. ............. 257/402
5,798,560 A * 8/1998 Ohkawa et al. ............. 257/555
5,926,729 A * 7/1999 Tsai et al. .................... 438/591
6,080,682 A * 6/2000 Ibok ............................ 438/770
6,156,595 A * 12/2000 Sawada ....................... 438/202
6,365,932 B1 * 4/2002 Kouno et al. ................ 257/341
6,420,771 B2 * 7/2002 Gregory ....................... 257/517

(Continued)

FOREIGN PATENT DOCUMENTS

JP    2000-216257    8/2000

(Continued)

*Primary Examiner*—Matthew S. Smith
*Assistant Examiner*—Ankush K Singal
(74) *Attorney, Agent, or Firm*—Harness, Dickey & Pierce, P.L.C.

(57) ABSTRACT

A method of fabricating a semiconductor device including gate dielectrics having different thicknesses may be provided. A method of fabricating a semiconductor device may include providing a substrate having a higher voltage device region and a lower voltage device region, forming an anti-oxidation layer on the substrate, and selectively removing portions of the anti-oxidation layer on the substrate. The method may also include performing a first thermal oxidization on the substrate to form a field oxide layer on the selectively removed portions of the anti-oxidation layer, removing the anti-oxidation layer disposed on the higher voltage device region, performing a second thermal oxidization on the substrate to form a central higher voltage gate oxide layer on the higher voltage device region, removing the anti-oxidation layer disposed on the lower voltage device region, and performing a third thermal oxidization on the substrate to form a lower voltage gate oxide layer on the lower voltage device region.

20 Claims, 8 Drawing Sheets

U.S. PATENT DOCUMENTS

| | | | |
|---|---|---|---|
| 6,750,159 B2* | 6/2004 | Abe | 438/263 |
| 6,770,550 B2* | 8/2004 | Kunikiyo | 438/585 |
| 6,803,634 B2* | 10/2004 | Okuno et al. | 257/378 |
| 6,855,611 B2* | 2/2005 | Chen et al. | 438/309 |
| 6,953,718 B2* | 10/2005 | Hayashi | 438/199 |
| 7,018,884 B2* | 3/2006 | Berthold et al. | 438/202 |
| 7,067,899 B2* | 6/2006 | Kanda et al. | 257/556 |
| 2003/0042541 A1* | 3/2003 | Rumennik et al. | 257/343 |
| 2003/0151093 A1* | 8/2003 | Rumennik et al. | 257/343 |
| 2003/0151101 A1* | 8/2003 | Rumennik et al. | 257/393 |
| 2005/0056898 A1* | 3/2005 | Kaneko et al. | 257/373 |
| 2005/0272207 A1* | 12/2005 | Williams et al. | 438/261 |

FOREIGN PATENT DOCUMENTS

| | | |
|---|---|---|
| JP | 2004-273537 | 9/2004 |
| KR | 1020050040416 A | 5/2005 |

* cited by examiner

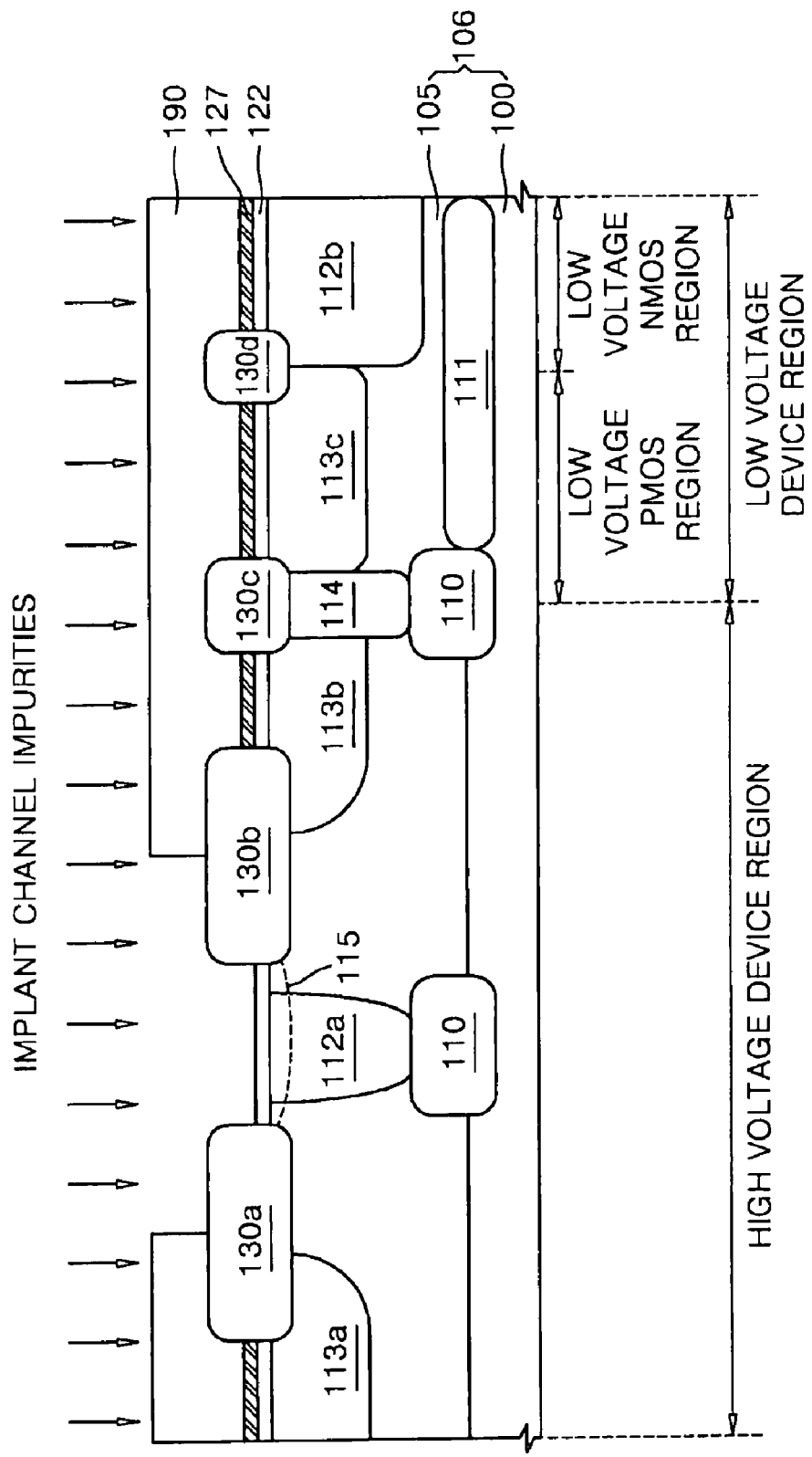

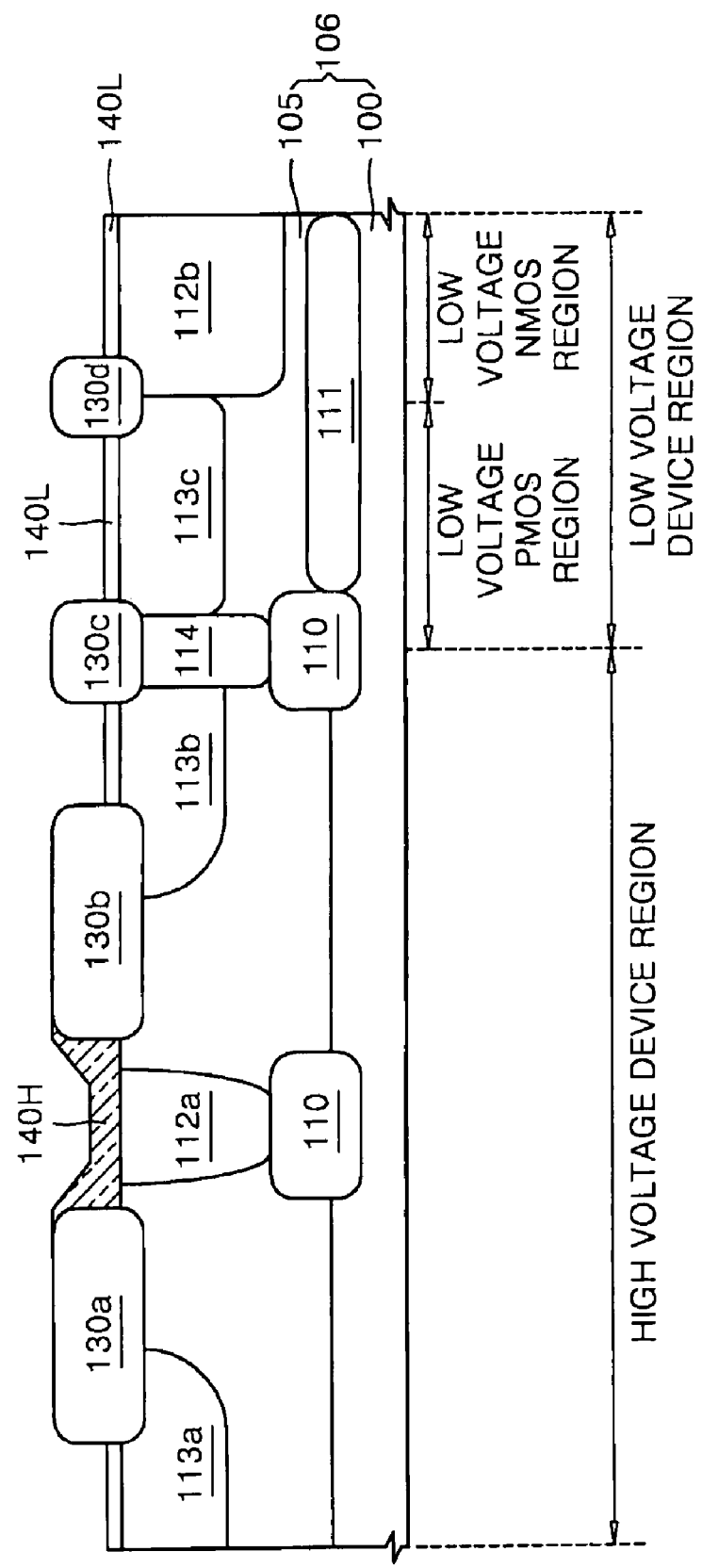

METHOD OF FABRICATING SEMICONDUCTOR DEVICE HAVING GATE DIELECTRICS WITH DIFFERENT THICKNESSES

PRIORITY CLAIM

A claim of priority is made to Korean Patent Application No. 10-2006-0067097, filed on Jul. 18, 2006, in the Korean Intellectual Property Office, the disclosure of which is incorporated herein in its entirety by reference.

BACKGROUND

1. Field

Example embodiments may relate to a method of fabricating a semiconductor device, and more particularly, to a method of fabricating a semiconductor device having gate dielectrics with different thicknesses.

2. Description of the Related Art

Several devices formed on a substrate require different operating voltages. For example, a power voltage is applied directly to an input/output unit or a peripheral circuit region, but the power voltage is dropped to a lower voltage by a voltage drop circuit before the voltage may be applied to a memory device or another peripheral circuit region.

High (or higher) voltage transistors and low (or lower) voltage transistors may be structured differently due to their different operating voltages. For example, each of the transistors has a gate oxide layer with different thicknesses with respect to each other.

To form transistors with gate oxide layers with different thicknesses with respect to each other, a field oxide layer is formed on a substrate and then a thick layer of gate oxide is formed on the entire surface of the substrate. The thick gate oxide layer is etched in a lower voltage region to form a thin gate oxide layer. However, the etching may also etch and recess the field oxide layer around the lower voltage region, which may lead to an excessively lower device isolation breakdown voltage.

SUMMARY

Example embodiments may provide methods of fabricating a semiconductor device including gate oxide layers having different thicknesses.

In an example embodiment, a method of fabricating a semiconductor device may include providing a substrate having a higher voltage device region and a lower voltage device region, forming an anti-oxidation layer on the substrate, and selectively removing portions of the anti-oxidation layer on the substrate. The method may also include performing a first thermal oxidization on the substrate to form a field oxide layer on the selectively removed portions of the anti-oxidation layer, selectively removing the anti-oxidation layer disposed on the higher voltage device region, performing a second thermal oxidization on the substrate to form a central higher voltage gate oxide layer on the higher voltage device region, selectively removing the anti-oxidation layer disposed on the lower voltage device region, and performing a third thermal oxidization on the substrate to form a lower voltage gate oxide layer on the lower voltage device region.

In another example embodiment, a method of fabricating a semiconductor device may include providing a substrate having a higher voltage device region and a lower voltage device region, the higher voltage device region having higher voltage source/drain regions surrounding a higher voltage channel region, forming an anti-oxidation layer on the higher voltage device region and the lower voltage device region, and selectively removing portions of the anti-oxidation layer. The method may further include performing a first thermal oxidization on the substrate to form a field oxide layer on the selectively removed portions of the anti-oxidation layer, wherein the side higher voltage gate oxide layers are located at both sides of the higher voltage channel region, selectively removing the anti-oxidation layer between the side higher voltage gate oxide layers, performing a second thermal oxidization on the substrate to form a central higher voltage gate oxide layer on the higher voltage channel region, selectively removing the anti-oxidation layer on the lower voltage device region, and performing a third thermal oxidization the substrate to form a lower voltage gate oxide layer on the lower voltage device region.

BRIEF DESCRIPTION OF THE DRAWINGS

The above and other features of example embodiments may be become more apparent with reference to the detail description thereof with reference to the attached drawings in which:

FIGS. 1A through 1F are sectional views illustrating a method of fabricating a semiconductor device according to an example embodiment;

DETAILED DESCRIPTION OF EXAMPLE EMBODIMENTS

Figure 1A:
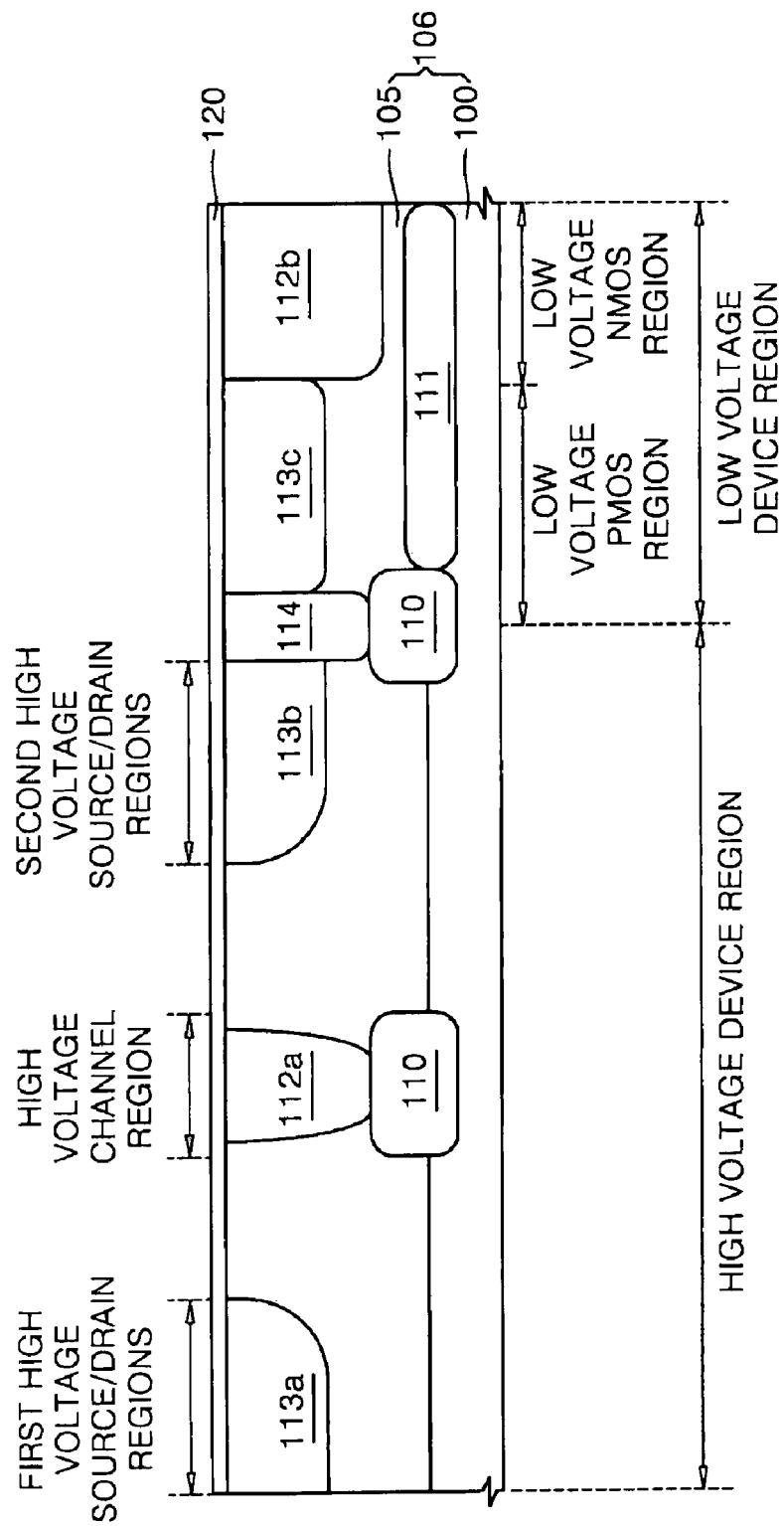

Example embodiments will now be described more fully with reference to the accompanying drawings. Example embodiments may, however, be embodied in many different forms, and should not be construed as being limited to the example embodiments set forth herein. Rather, example embodiments are provided so that this disclosure will be thorough and complete, and will fully convey the broad scope to those skilled in the art. Like numbers refer to like elements throughout the specification.

It will be understood that when an element or layer is referred to as being "on", "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there may be no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Numerically relative terms, such as "higher" and "lower", may be used herein for ease of description to describe one element or feature's relationship to another element(s) or feature(s) as illustrated in the figures. It will be understood that the numerically relative terms may be intended to encompass different values or ranges of the device in use or operation in addition to the terms described.

The terminology used herein is for the purpose of describing particular example embodiments only and is not intended to be limiting. As used herein, the singular forms "a", "an" and "the" may be intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments may be described herein with reference to cross-section illustrations that may be schematic illustrations of idealized embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to limit example embodiments.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1A through 1F are sectional views illustrating a method of fabricating a semiconductor device according to an example embodiment.

Referring to FIG. 1A, a base substrate 100 may include a high (or higher) voltage device region and a low (or lower) voltage device region. The higher voltage device region may include a first higher voltage source/drain region, a second higher voltage source/drain region, and a higher voltage channel region between the first and second voltage source/drain regions. The lower voltage device region may include a lower voltage PMOS region and a lower voltage NMOS region. The base substrate 100 may be a first conductivity type substrate.

A first mask pattern (not shown) may be formed on the base substrate 100. First conductivity type impurities may be implanted into the base substrate 100 at a higher concentration using the first mask pattern as a mask to form first buried impurity layers 110. The first mask pattern may be removed. A second mask pattern (not shown) may be formed on the base substrate 100. Second conductivity type impurities may be implanted at a higher concentration using the second mask pattern as a mask to form a second buried impurity layer 111. The second mask pattern may be removed. One of the first buried impurity layers 110 may be formed at a position corresponding (e.g., above) to a channel region of the higher voltage device region. Another one of the first buried impurity layers 110 may be formed between the higher voltage device region and the lower voltage device region. The second buried impurity layer 111 may be formed over the entire lower voltage device region. The first conductivity type may be a p-type, and the second conductivity type may be an n-type.

A lower concentration of a second conductivity type, for example, a lower concentration n-type epitaxial layer 105 may be formed on the base substrate 100 and the first and second buried impurity layers 110 and 111. The epitaxial layer 105 may be formed to a thickness of about 10 mm, and the resistivity of the epitaxial layer 105 may be about 2 Ω. Thus, a substrate 106 including the base substrate 100 and the epitaxial layer 105 may be formed.

A sacrificial oxide layer 120 may be formed on the epitaxial layer 105. A third mask pattern (not shown) may be formed on the sacrificial oxide layer 120. The third mask pattern may expose a portion defining where the higher voltage device region contacts the lower voltage device region. First conductivity type impurities, for example, p-type impurities, may be implanted into the epitaxial layer 105 using the third mask pattern as a mask to form an isolation impurity region 114. The third mask pattern may be removed. The isolation impurity region 114 may electrically separate a lower voltage device formed in the lower voltage device region from a higher voltage device formed in the higher voltage device region.

A fourth mask pattern (not shown) may be formed on the sacrificial oxide layer 120. The fourth mask pattern may expose the first and second higher voltage source or drain regions and the lower voltage PMOS region. A second conductivity type, for example, n-type impurities, may be implanted into the epitaxial layer 105 using the fourth mask pattern as a mask to form n-type wells 113a, 113b and 113c. The fourth mask pattern may be removed. The n-type wells 113a and 113b formed in the first and second higher voltage source or drain regions may be first and second drift regions.

A fifth mask pattern (not shown) may be formed on the sacrificial oxide layer 120. The fifth mask pattern may expose the higher voltage channel region and the lower voltage NMOS region. A first conductivity type, for example, p-type impurities, may be implanted into the epitaxial layer 105 using the fifth mask pattern as a mask to form p-type wells 112a and 112b. The fifth mask pattern may be removed. The p-type well 112a formed in the higher voltage channel region may be a body region 112a of the higher voltage device region.

Figure 1B:
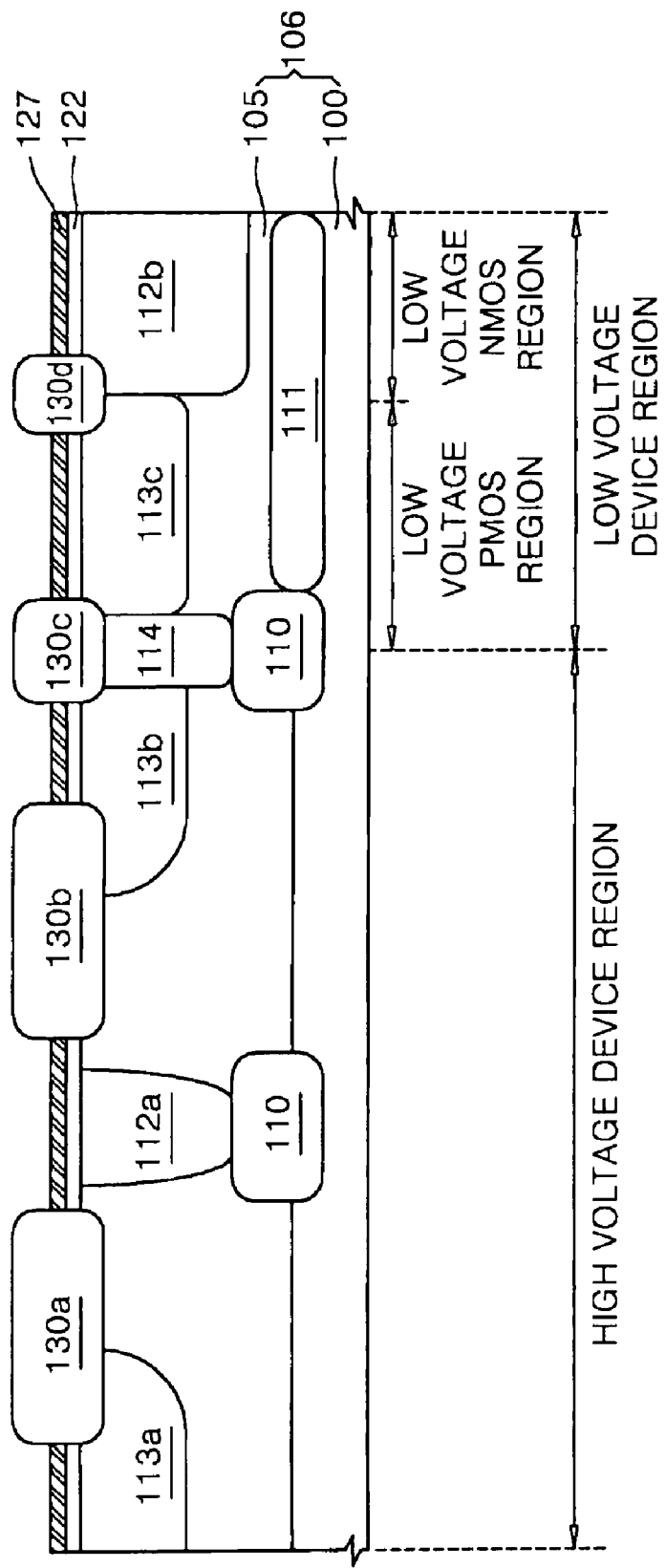

Referring to FIG. 1B, the sacrificial oxide layer 120 (FIG. 1A) may be removed, and a pad oxide layer 122 may be formed on the epitaxial layer 105. An anti-oxidation layer 127 may be formed on the pad oxide layer 122. The anti-oxidation layer 127 may be formed to a thickness of about 1500 Å. The anti-oxidation layer 127 may be a silicon nitride layer.

A sixth mask pattern (not shown) may be formed on the anti-oxidation layer 127. The anti-oxidation layer 127 may be etched using the sixth mask pattern as a mask. The sixth mask pattern may be removed. The substrate 106 may be thermally oxidized to form first and second side higher voltage gate oxide layers 130a and 130b and first and second field oxide layers 130c and 130d in regions where the anti-oxidation layer 127 had been etched. Each of the first and second side higher voltage gate oxide layers 130a and 130b and the first and second field oxide layers 130c and 130d may be formed to a thickness of about 8000 Å. The first and second side higher voltage gate oxide layers 130a and 130b may be located at each side of the higher voltage channel region, and the first and second side higher voltage gate oxide layers 130a and 130b may partially overlap the higher voltage source or drain regions. The first field oxide layer 130c may be located between the higher voltage device region and the lower voltage device region to electrically separate the higher voltage device region and the lower voltage device region along with the isolation impurity region 114. The second field oxide layer 130d may be located between the lower voltage PMOS region and the lower voltage NMOS region to electrically separate the lower voltage PMOS region and the low voltage NMOS region.

Referring to FIG. 1C, a seventh mask pattern 190 exposing at least the higher voltage channel region on the substrate 106 may be formed. The anti-oxidation layer 127 formed on the higher voltage channel region may be selectively etched using the seventh mask pattern 190 as a mask, exposing the pad oxide layer 122 of the higher voltage channel region.

Channel impurities may be implanted into the epitaxial layer 105 using the seventh mask pattern 190 as a mask to form a channel impurity region 115. The channel impurity region 115 may allow an on resistance of the higher voltage device to be controlled.

Figure 1D:
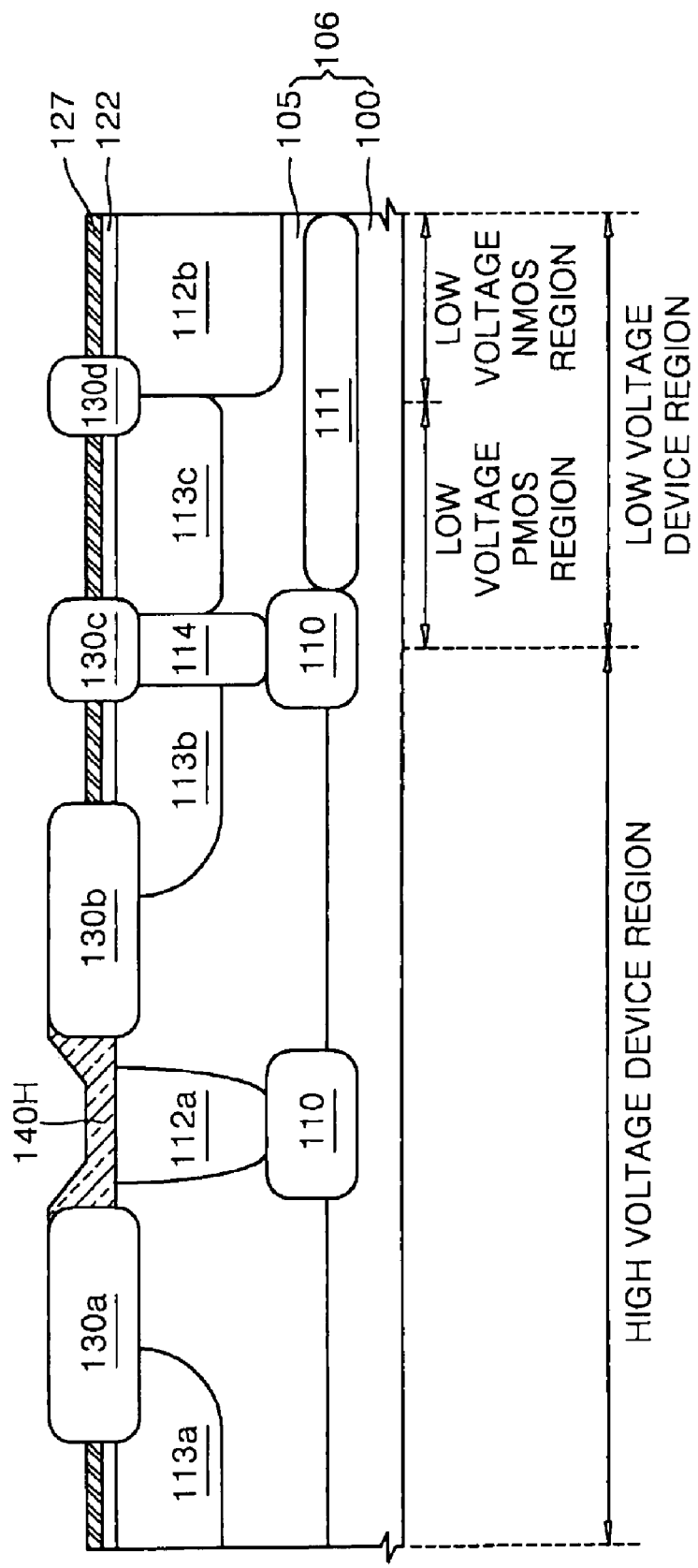

Referring to FIG. 1D, the seventh mask pattern 190 and the pad oxide layer 122 exposed on the higher voltage channel region may be removed. The substrate 106 may be thermally oxidized. As a result, a higher voltage gate oxide layer 140H may be formed on the higher voltage channel region between the first and second side higher voltage gate oxide layers 130a and 130b. The higher voltage gate oxide layer 140H may be formed to a thickness of about 2000 Å, which may be thinner than the first and second side higher voltage gate oxide layers 130a and 130b.

When the higher voltage gate oxide layer 140H is formed, the anti-oxidation layer 127 may remain on the regions other than the higher voltage channel region and the thick field oxide layers 130a, 130b, 130c, and 130d to prevent the thermal oxidation process from forming an oxide layer. As a result, the higher voltage gate oxide layer 140H may be selectively formed only on the higher voltage channel region.

Referring to FIG. 1E, the anti-oxidation layer 127 and the pad oxide layer 122 below the anti-oxidation layer 127 may be removed. When the pad oxide layer 122 is removed, the first and second field oxide layers 130c and 130d and the first and second higher voltage gate oxide layers 130a and 130b may be partially etched. However, since the thickness of the first and second field oxide layers 130c and 130d and the first and second higher voltage gate oxide layers 130a and 130b may be may greater than the thickness of the pad oxide layer 122, the etch loss may be insignificant.

The substrate 106 may be thermally oxidized to form a lower voltage gate oxide layer 140L on the lower voltage region. The lower voltage gate oxide layer 140L may be formed to a thickness of about 185 Å.

Figure 1F:
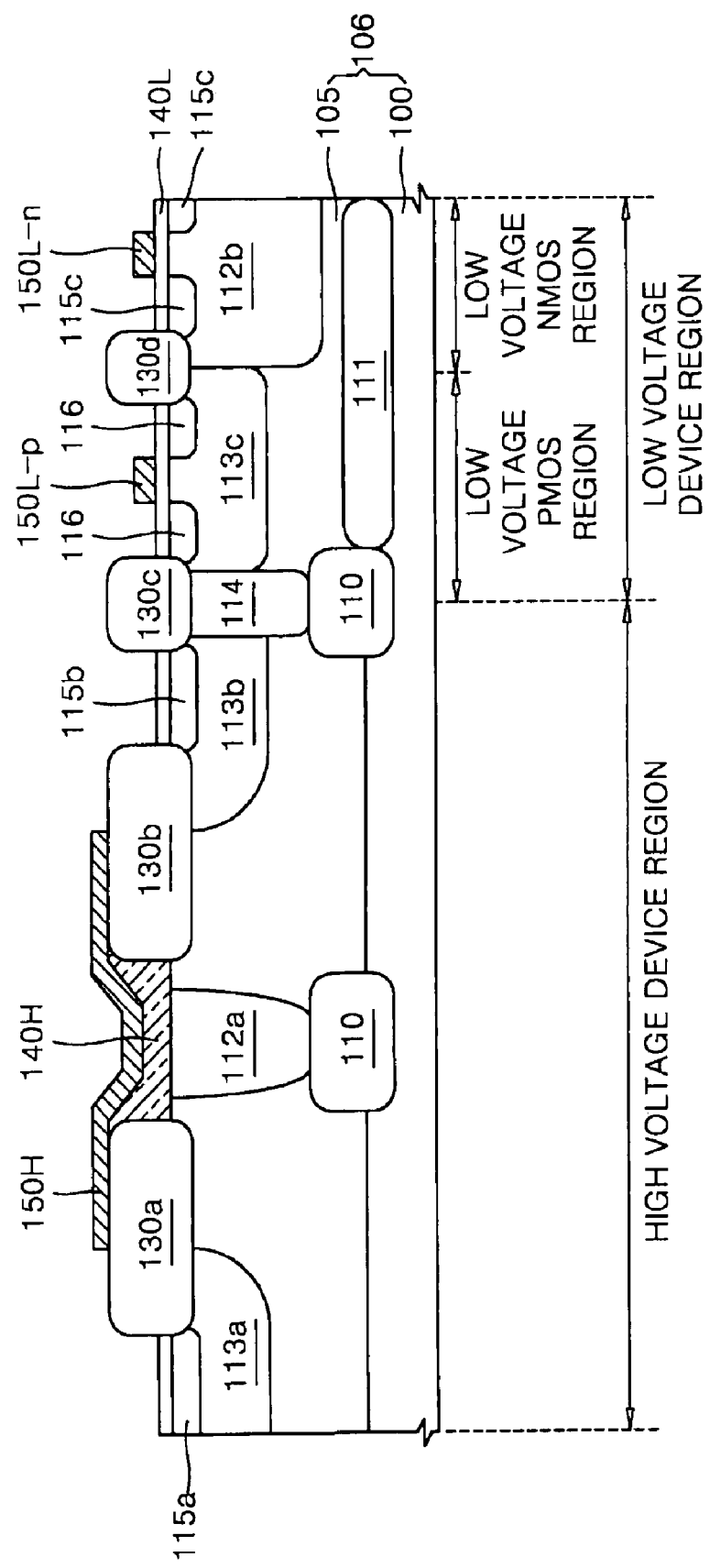

Referring to FIG. 1F, a gate conductive layer may be stacked on the substrate 106 and patterned to form a higher voltage gate electrode 150H overlapping the higher voltage channel region. A lower voltage PMOS gate electrode 150L_p and a lower voltage NMOS gate electrode 150L_n may also be formed on the lower voltage PMOS region and the lower voltage NMOS region, respectively.

An eighth mask pattern (not shown) exposing the higher voltage device region and the lower voltage NMOS region may be formed. Second conductivity type impurities may be implanted at a higher concentration using the mask pattern, the higher voltage gate electrode 150H, and the lower voltage NMOS gate electrode 150L_n as masks to form higher voltage source/drains 115a and 115b in the first and second higher voltage source/drain regions, respectively, and to form a lower voltage NMOS source/drain 115c in the lower voltage NMOS region. The eighth mask pattern may be removed. The higher voltage source/drain 115a and 115b may be respectively formed in the drift regions 113a and 113b.

A ninth mask pattern (not shown) exposing the lower voltage PMOS device region may be formed. First conductivity type impurities may be implanted at a higher concentration using the ninth mask pattern and the lower voltage PMOS gate electrode 150L_p as masks to form lower voltage PMOS source/drains 116 in the lower voltage PMOS region. The ninth mask pattern may be removed.

The higher voltage device formed on the higher voltage device region may include the higher voltage gate electrode 150H, the higher voltage source/drain 115a and 115b, the drift regions 113a and 113b, and the body region 112a. The higher voltage source/drain 115a and 115b may be formed in the drift regions 113a and 113b having a lower concentration. Thus, a higher voltage device may be formed as a double diffused MOS transistor (DMOS Tr) having a higher junction breakdown voltage even when a higher voltage may be applied to the source/drain 115a and 115b. Furthermore, since the n-type epitaxial layer 105 having a lower impurity concentration may be disposed between one of the drift regions 113a and 113b and the p-type body region 112a, the junction breakdown voltage of the source/drain of the higher voltage device may increase.

Further, since the first and second side higher voltage gate oxide layers 130a and 130b may be formed together with the first and second field oxide layers 130c and 130d, the first and second side higher voltage gate oxide layers 130a and 130b may be formed to be thicker than the central gate oxide layer 140H. Thus, the dielectric breakdown voltage between the gate electrode 150H and the source/drain 115a and 115b may increase. Even further, since the central gate oxide layer 140H may be thinner than the first and second field oxide layers 130c and 130d, the current density of the higher voltage channel region may increase.

Further, the source/drain regions of the higher voltage device may be symmetrical. Thus, the higher voltage device may be a bidirectional device.

Figure 2:
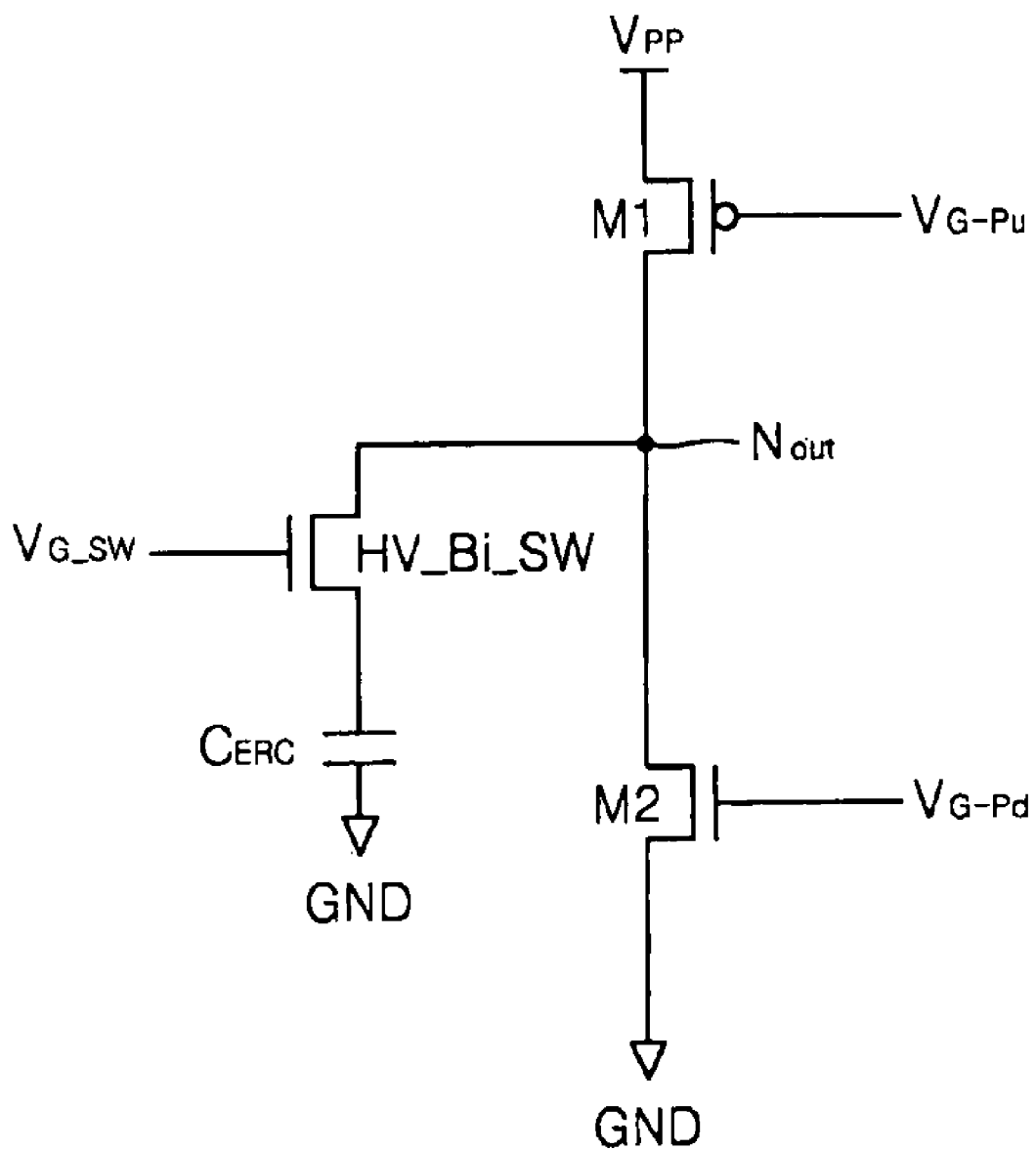
FIG. 2 is a circuit diagram illustrating a circuit employing a higher voltage device formed according to an example embodiment.

FIG. 2 is a circuit diagram illustrating a circuit employing a higher voltage device fabricated according to an example embodiment, and may illustrate a part of an energy recovery circuit (ERC).

Referring to FIG. 2, an ERC may include a pull-up device M1, a pull-down device M2, an energy recovery capacitor $C_{ERC}$, and a bidirectional higher voltage switching device HV_Bi_SW. The bidirectional higher voltage switching device HV_Bi_SW may be a higher voltage device fabricated using the method described with reference to FIGS. 1A through 1F. The pull-up device M1 may be connected between a power voltage terminal $V_{pp}$ and an output node $N_{out}$ to transfer a power voltage to the output node $N_{out}$. The pull-down device M2 may be connected between a ground voltage terminal and the output node $N_{out}$ to transfer a ground voltage to the output node $N_{out}$. The energy recovery capacitor $C_{ERC}$ may be connected between the output node $N_{out}$ and a ground voltage terminal. The bidirectional higher voltage switching device HV_Bi_SW may be connected between the output node $N_{out}$ and the energy recovery capacitor $C_{ERC}$ to transfer the voltage charged in the output node $N_{out}$ to the energy recovery capacitor $C_{ERC}$, or transfer the voltage charged in the energy recovery capacitor $C_{ERC}$ to the output node $N_{out}$. Thus, the energy consumed when the power voltage is higher may be effectively reduced by storing the power voltage in the energy recovery capacitor $C_{ERC}$.

Signal $V_{G\_}$pu may activate the pull-up device M1, signal $V_{G\_}$pd may activate the pull-down device M2, and signal $V_{G\_}$sw may activate the bidirectional higher voltage switching device HV_Bi_SW.

Figure 3A:
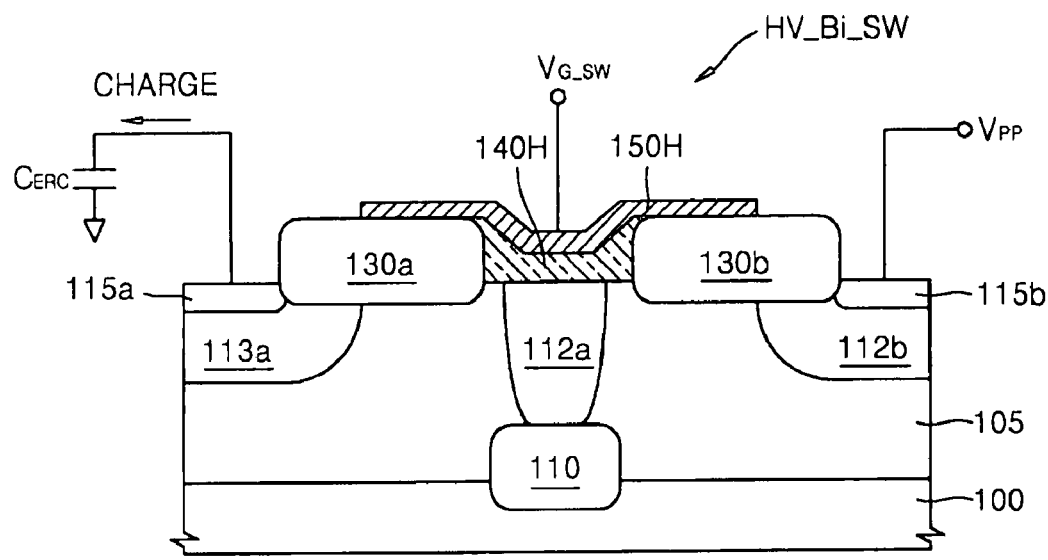
FIGS. 3A and 3B are schematic sectional views illustrating operations of the higher voltage device of FIG. 2 according to an example embodiment.
Figure 3B:
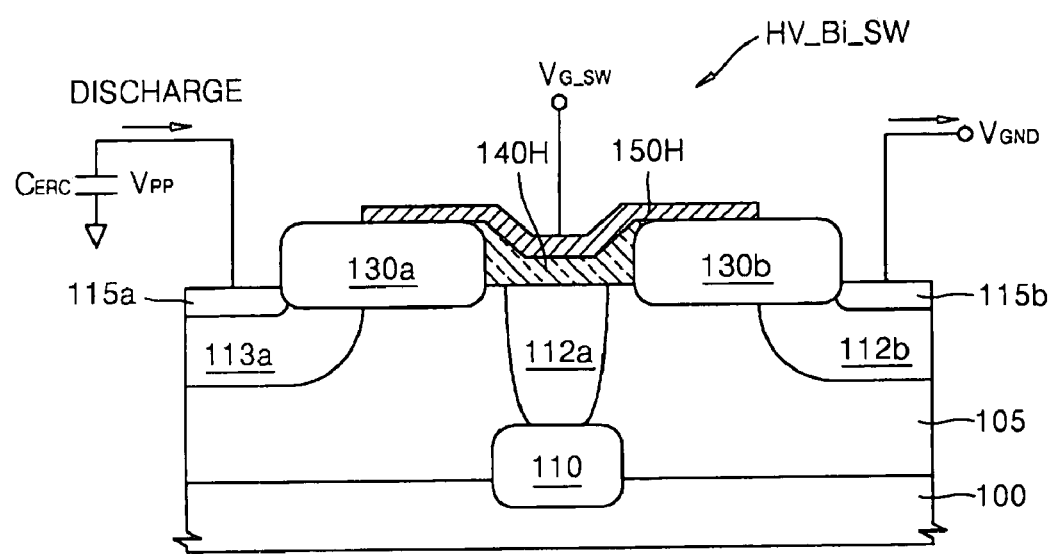

FIGS. 3A and 3B are schematic sectional views illustrating the operation of the higher voltage semiconductor device.

Referring to FIGS. 2 and 3A, when the pull-up device M1 is activated and the pull-down device M2 is deactivated, a power voltage $V_{pp}$ may be transferred to an output node $N_{out}$. The bidirectional higher voltage switching device HV_Bi_SW may be activated, and the power voltage $V_{pp}$ may be charged in the energy recovery capacitor $C_{ERC}$.

When the pull-up device M1 is deactivated and the pull-down device M2 is activated, a ground voltage $V_{GND}$ may be transferred to the output node Nout. When the bidirectional higher voltage switching device HV_Bi_SW is activated, the voltage charged in the energy recovery capacitor $C_{ERC}$ may be discharged.

As described above, according to example embodiments, the anti-oxidation layer may be patterned and used to form the field oxide layer, and then the patterned anti-oxidation layer may be re-patterned and used to form the higher voltage gate oxide layer. Thus, it may not be necessary to form another anti-oxidation layer to form the higher voltage gate oxide layer. Therefore, the number of fabrication processes may be reduced. Further, the anti-oxidation layer may prevent a thick oxide layer from forming on the lower voltage device region when the field oxide layers and the higher voltage gate oxide layer are formed. Thus, recessing of the field oxide layer, which may occur when removing the thick oxide layer from the lower voltage device region, may be prevented.

While example embodiments have been particularly shown and described, it will be understood by those of ordinary skill in the art that various changes in form and detail may be made therein without departing from scope of example embodiments.

What is claimed is:

1. A method of fabricating a semiconductor device, comprising:
   providing a substrate having a higher voltage device region and a lower voltage device region;
   forming an anti-oxidation layer on the substrate;
   selectively removing portions of the anti-oxidation layer on the substrate;
   performing a first thermal oxidization on the substrate to form a field oxide layer on the selectively removed portions of the anti-oxidation layer;
   selectively removing the anti-oxidation layer disposed on the higher voltage device region;
   performing a second thermal oxidization on the substrate to form a central higher voltage gate oxide layer on the higher voltage device region;
   selectively removing the anti-oxidation layer disposed on the lower voltage device region; and
   performing a third thermal oxidization on the substrate to form a lower voltage gate oxide layer on the lower voltage device region.

2. The method of claim 1, further comprising:
   forming side higher voltage gate oxide layers on the higher voltage device region concurrently with the formation of the field oxide layer, wherein the central higher voltage gate oxide layer is formed between the side higher voltage gate oxide layers.

3. The method of claim 1, wherein the central higher voltage gate oxide layer has a thickness less than a thickness of the field oxide layer.

4. The method of claim 3, wherein the central higher voltage gate oxide layer has a thickness of about 2000 Å.

5. The method of claim 3, wherein the field oxide layer is formed to a thickness of about 8000 Å.

6. The method of claim 1, wherein the anti-oxidation layer is a silicon nitride layer.

7. The method of claim 1, wherein the substrate is provided by forming an epitaxial layer on a base substrate.

8. The method of claim 1, further comprising:
   forming an isolation impurity region on the substrate configured to separate the higher voltage device region and the lower voltage device region.

9. A method of fabricating a semiconductor device, comprising:
   providing a substrate having a higher voltage device region and a lower voltage device region, the higher voltage device region having higher voltage source/drain regions surrounding a higher voltage channel region;
   forming an anti-oxidation layer on the higher voltage device region and the lower voltage device region;
   selectively removing portions of the anti-oxidation layer;
   performing a first thermal oxidization on the substrate to form a field oxide layer on the selectively removed portions of the anti-oxidation layer, wherein the side higher voltage gate oxide layers are located at both sides of the higher voltage channel region;
   selectively removing the anti-oxidation layer between the side higher voltage gate oxide layers;
   performing a second thermal oxidization on the substrate to form a central higher voltage gate oxide layer on the higher voltage channel region;
   selectively removing the anti-oxidation layer on the lower voltage device region; and
   performing a third thermal oxidization the substrate to form a lower voltage gate oxide layer on the lower voltage device region.

10. The method of claim 9, further comprising:
    implanting impurities of a first type into the higher voltage source/drain regions to form drift regions.

11. The method of claim 10, wherein the first type impurity is an n-type impurity.

12. The method of claim 11, wherein the second type impurity is a p-type impurity.

13. The method of claim 10, further comprising:
    forming a body region by implanting impurities of a second type into the higher voltage channel region.

14. The method of claim 9, wherein the central higher voltage gate oxide layer is formed to have a thickness less than a thickness of the field oxide layer.

15. The method of claim 9, wherein the anti-oxidation layer is a silicon nitride layer.

16. The method of claim 9, wherein the substrate is provided by forming an epitaxial layer on a base substrate.

17. The method of claim 9, wherein the anti-oxidation layer has a thickness of about 1,500 Å.

18. The method of claim 9, further comprising:
forming at least one first buried impurity layer in the higher voltage device region.

19. The method of claim 18, further comprising:
forming at least one second buried impurity layer in the lower voltage device region.

20. The method of claim 9, further comprising:
forming an isolation impurity region on the substrate and configured to separate the higher voltage device region and the lower voltage device region.

* * * * *